United States Patent
Tanabe et al.

(10) Patent No.: US 11,610,860 B2
(45) Date of Patent: Mar. 21, 2023

(54) WIRE BONDING APPARATUS AND WIRE BONDING METHOD

(71) Applicants: KABUSHIKI KAISHA TOSHIBA, Tokyo (JP); Kioxia Corporation, Tokyo (JP)

(72) Inventors: Masatoshi Tanabe, Yokohama (JP); Takashi Ito, Yokohama (JP); Kazuo Shimokawa, Yokohama (JP); Akira Tojo, Naka (JP)

(73) Assignees: KABUSHIKI KAISHA TOSHIBA, Tokyo (JP); Kioxia Corporation, Tokyo (JP)

( * ) Notice: Subject to any disclaimer, the term of this patent is extended or adjusted under 35 U.S.C. 154(b) by 231 days.

(21) Appl. No.: 17/018,014

(22) Filed: Sep. 11, 2020

(65) Prior Publication Data

US 2021/0091038 A1    Mar. 25, 2021

(30) Foreign Application Priority Data

Sep. 19, 2019   (JP) .............................. JP2019-170115
Jan. 21, 2020   (JP) .............................. JP2020-007451

(51) Int. Cl.
| | |
|---|---|
| *H01L 21/67* | (2006.01) |
| *H01L 23/00* | (2006.01) |
| *H01L 21/50* | (2006.01) |
| *B23K 20/10* | (2006.01) |
| *H01L 21/60* | (2006.01) |

(52) U.S. Cl.
CPC .............. *H01L 24/78* (2013.01); *B23K 20/10* (2013.01); *H01L 21/50* (2013.01);
(Continued)

(58) Field of Classification Search
CPC ... H01L 24/78; H01L 21/50; H01L 21/67253; H01L 2021/60195; H01L 2224/78;
(Continued)

(56) References Cited

U.S. PATENT DOCUMENTS 8,899,469 B2 *  12/2014  Gillotti .................. H01L 24/78
                                                        228/103
9,981,337 B2 *   5/2018  Simon .................... G01N 29/12
(Continued)

FOREIGN PATENT DOCUMENTS

CN         1149762 A  *  5/1997 ............. H01L 24/78
CN       110168145 B  *  8/2021 ........... C07D 233/58
(Continued)

*Primary Examiner* — Mohammed Shamsuzzaman
(74) *Attorney, Agent, or Firm* — Oblon, McClelland, Maier & Neustadt, L.L.P.

(57) ABSTRACT

A wire bonding apparatus according to an embodiment bonds a wire to a bonding portion by generating an ultrasonic vibration in a state of pressing the wire onto the bonding portion. The wire bonding apparatus includes a bonding tool that causes the wire to contact the bonding portion and applies a load, an ultrasonic horn that generates the ultrasonic vibration, a load sensor that continuously detects the load applied from the bonding tool to the bonding portion, and a controller that controls the operation of the bonding tool and the ultrasonic horn. The controller analyzes data of the load output from the load sensor between when the wire contacts the bonding portion and when the ultrasonic vibration is generated, and controls the operation of the bonding tool and the ultrasonic horn based on an analysis result.

7 Claims, 10 Drawing Sheets

(52) U.S. Cl.
CPC .......... *H01L 21/67253* (2013.01); *H01L 2021/60195* (2013.01); *H01L 2224/78* (2013.01)

(58) Field of Classification Search
CPC ........... H01L 24/48; H01L 2224/48478; H01L 2224/78353; H01L 2224/78901; H01L 2224/7892; H01L 24/85; H01L 24/45; H01L 2224/85051; H01L 2224/45124; H01L 2224/45139; H01L 2224/45144; H01L 2224/45147; H01L 2224/78301; H01L 2224/85205; H01L 2224/859; H01L 21/67138; B23K 20/10; B23K 20/004

See application file for complete search history.

(56) References Cited

U.S. PATENT DOCUMENTS

| | | | |
|---|---|---|---|
| 10,960,488 B2 * | 3/2021 | Hunstig | ............ H01L 24/85 |
| 2011/0146408 A1 * | 6/2011 | Aoyagi | ............ B23K 20/007 |
| | | | 73/588 |

FOREIGN PATENT DOCUMENTS

| | | | | |
|---|---|---|---|---|
| JP | 10-98064 A | | 4/1998 | |
| JP | 4275724 B1 | | 6/2009 | |
| JP | 2010067780 A | * | 3/2010 | ......... B23K 20/005 |
| JP | 2010-147328 A | | 7/2010 | |
| JP | 2013-225637 A | | 10/2013 | |
| JP | 2015-153907 A | | 8/2015 | |
| JP | 2018-49910 A | | 3/2018 | |

* cited by examiner

WIRE BONDING APPARATUS AND WIRE BONDING METHOD

CROSS-REFERENCE TO RELATED APPLICATIONS

This application is based upon and claims the benefit of priority from Japanese Patent Application No. 2019-170115, filed on Sep. 19, 2019 and No. 2020-007451, filed on Jan. 21, 2020; the entire contents of which are incorporated herein by reference.

FIELD

Embodiments described herein relate generally to a wire bonding apparatus and a wire bonding method.

BACKGROUND

A known wire bonding apparatus bonds a wire to a bonding portion of a workpiece (Patent Literature 1). It is desirable to suppress the occurrence of a bonding defect between the bonding portion and the wire in such a wire bonding apparatus.

DETAILED DESCRIPTION

Figure 1:
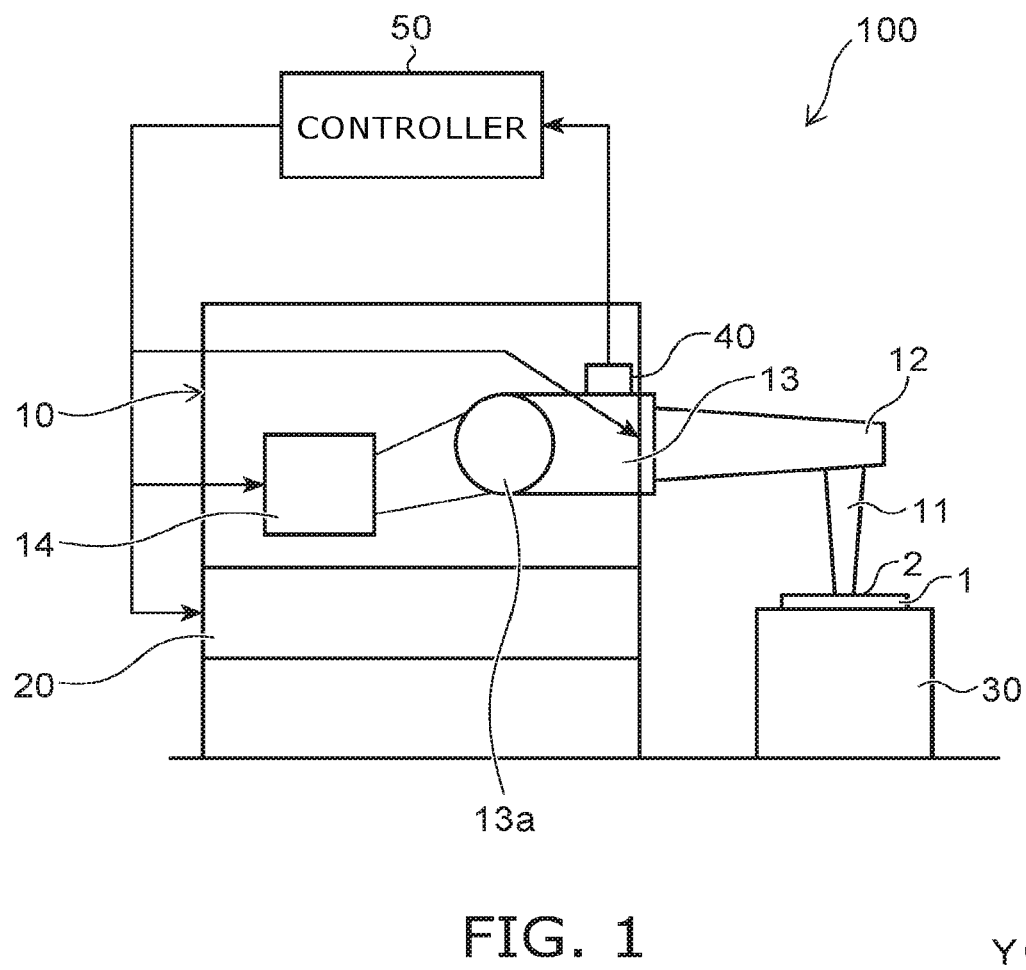
FIG. 1 is a schematic view schematically illustrating a wire bonding apparatus according to an embodiment.

A wire bonding apparatus according to an embodiment bonds a wire to a bonding portion by generating an ultrasonic vibration in a state of pressing the wire onto the bonding portion. The wire bonding apparatus includes a bonding tool that causes the wire to contact the bonding portion and applies a load, an ultrasonic horn that generates the ultrasonic vibration, a load sensor that continuously detects the load applied from the bonding tool to the bonding portion, and a controller that controls the operation of the bonding tool and the ultrasonic horn. The controller analyzes data of the load output from the load sensor between when the wire contacts the bonding portion and when the ultrasonic vibration is generated, and controls the operation of the bonding tool and the ultrasonic horn based on an analysis result.

Various embodiments are described below with reference to the accompanying drawings.

The drawings are schematic and conceptual; and the relationships between the thickness and width of portions, the proportions of sizes among portions, etc., are not necessarily the same as the actual values. There are also cases where the dimensions and/or the proportions are illustrated differently between the drawings, even for identical portions.

In the specification and drawings, components similar to those described previously or illustrated in an antecedent drawing are marked with the same reference numerals, and a detailed description is omitted as appropriate.

FIG. 1 is a schematic view schematically illustrating a wire bonding apparatus according to an embodiment.

Figure 2:
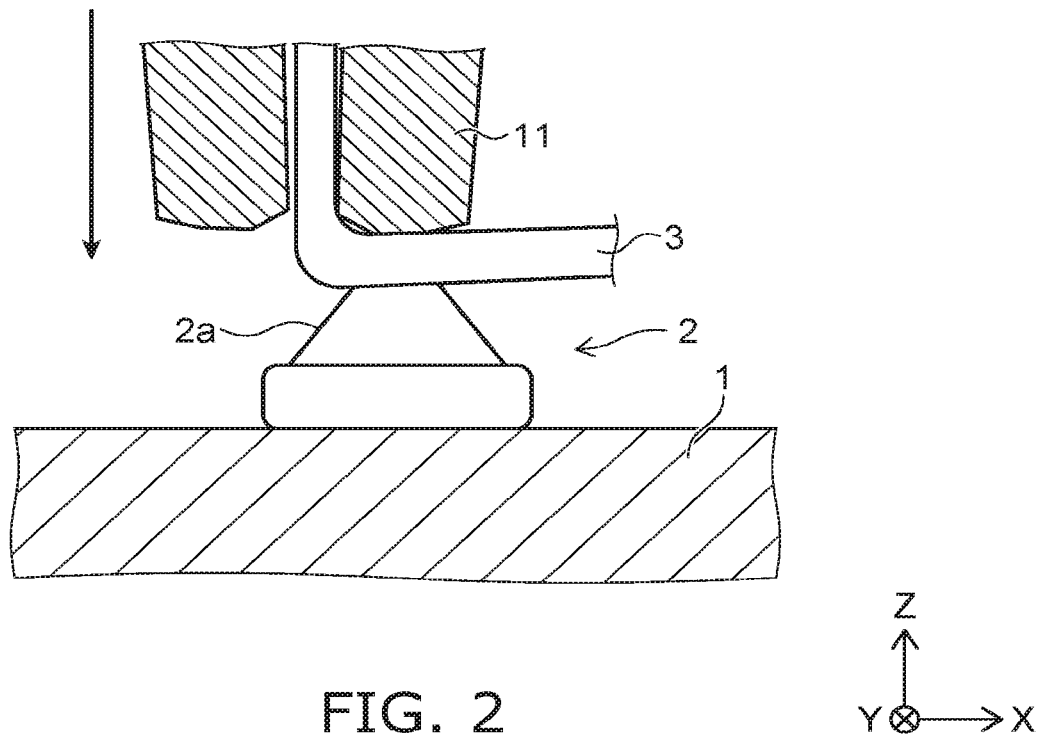
FIG. 2 is a schematic view schematically illustrating a portion of the wire bonding apparatus according to the embodiment.

FIG. 2 is a schematic view schematically illustrating a portion of the wire bonding apparatus according to the embodiment.

As illustrated in FIGS. 1 and 2, the wire bonding apparatus 100 according to the embodiment includes a bonding head 10, an X-Y stage 20, a bonding stage 30, a load sensor 40, and a controller 50.

The bonding head 10 includes a bonding tool 11, an ultrasonic horn 12, a bonding arm 13, and a driver 14.

The bonding tool 11 feeds a wire 3, which is a bonding material. The bonding tool 11 is, for example, a bonding capillary. The wire 3 is, for example, an aluminum wire, a gold wire, a silver wire, a copper wire, etc. The bonding tool 11 causes the wire 3 to contact a bonding portion 2 of a workpiece 1 placed on the bonding stage 30, and applies a load to the bonding portion 2.

The ultrasonic horn 12 generates an ultrasonic vibration. The ultrasonic horn 12 includes an ultrasonic vibrator that generates the ultrasonic vibration. The ultrasonic horn 12 supports the bonding tool 11. The ultrasonic vibration that is generated from the ultrasonic horn 12 is transferred to the wire 3 via the bonding tool 11. The wire 3 is bonded to the bonding portion 2 by the ultrasonic vibration being transferred to the wire 3 in a state in which the wire 3 contacts the bonding portion 2. The ultrasonic horn 12 is electrically connected to the controller 50.

The bonding arm 13 supports the ultrasonic horn 12. That is, the bonding arm 13 supports the bonding tool 11 via the ultrasonic horn 12. The bonding arm 13 is provided rotatably around an axial part 13a.

The driver 14 drives the bonding arm 13 in a Z-direction with the axial part 13a as the center. The driver 14 is, for example, a linear motor. The bonding tool 11 and the ultrasonic horn 12 that are supported by the bonding arm 13 are moved in the Z-direction by moving the bonding arm 13 in the Z-direction. By moving the bonding tool 11 in the Z-direction, the wire 3 can be caused to contact the bonding portion 2, and the load can be applied from the bonding tool 11. The driver 14 is electrically connected to the controller 50.

In this specification, the direction that connects the bonding tool 11 and the workpiece 1 is taken as the Z-direction.

A direction orthogonal to the Z-direction is taken as an X-direction. A direction orthogonal to the Z-direction and the X-direction is taken as a Y-direction.

The bonding head 10 is mounted on the X-Y stage 20. The X-Y stage 20 is movable in the X-direction and the Y-direction. The bonding head 10 is moved in the X-direction and the Y-direction by moving the X-Y stage 20 in the X-direction and the Y-direction. That is, the X-Y stage 20 functions as positioning means for positioning the bonding tool 11, etc., provided in the bonding head 10 in the X-direction and the Y-direction. The X-Y stage 20 is electrically connected to the controller 50.

The bonding stage 30 supports the workpiece 1, which is the object of the wire bonding. For example, the bonding stage 30 clamps and supports the workpiece 1. The workpiece 1 is, for example, a substrate or a semiconductor chip such as an IC chip, etc. For example, a bump 2a is provided in the bonding portion 2.

The load sensor 40 continuously detects the load applied from the bonding tool 11 to the bonding portion 2 of the workpiece 1. The load sensor 40 includes, for example, a strain gauge. The load sensor 40 may detect the load applied to the tip at the workpiece 1 side of the bonding tool 11. In the example, the load sensor 40 is mounted to the bonding arm 13. The load sensor 40 is electrically connected to the controller 50. The load sensor 40 outputs the data of the detected load to the controller 50.

The controller 50 controls the operations of the ultrasonic horn 12, the driver 14, and the X-Y stage 20. By controlling the ultrasonic horn 12, the controller 50 can control the output of the ultrasonic vibration generated from the ultrasonic horn 12.

The controller 50 can control the operation of the bonding tool 11 by controlling the operation of the driver 14. More specifically, the controller 50 can control the position in the Z-direction of the bonding tool 11 by driving the bonding arm 13 in the Z-direction by controlling the driver 14. Thereby, the controller 50 can control the magnitude of the load applied from the bonding tool 11 to the bonding portion 2.

The controller 50 can control the operation of the bonding tool 11 by controlling the operation of the X-Y stage 20. More specifically, the controller 50 can control the position in the X-direction and the Y-direction of the bonding tool 11 by driving the bonding head 10 in the X-direction and the Y-direction by controlling the X-Y stage 20.

The controller 50 analyzes the data of the load output from the load sensor 40 and controls the operation of the bonding tool 11 and the ultrasonic horn 12 based on the analysis result. The analysis of the data of the load and the control based on the analysis by the controller 50 are described below.

As illustrated in FIG. 2, the wire bonding apparatus 100 bonds the wire 3 to the bonding portion 2 by the ultrasonic vibration being generated from the ultrasonic horn 12 in a state in which the wire 3 that is fed from the bonding tool 11 is pressed onto the bonding portion 2 of the workpiece 1 placed on the bonding stage 30.

Figure 3:
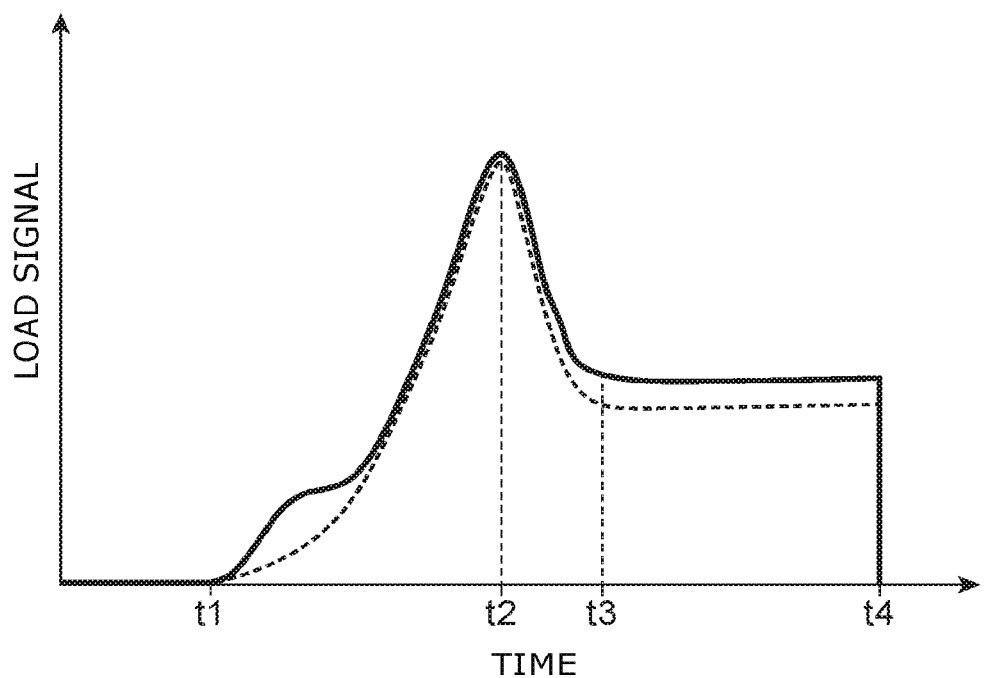
FIG. 3 is a graph showing an example of a load signal waveform output from the load sensor when performing wire bonding.

FIG. 3 is a graph showing an example of a load signal waveform output from the load sensor when performing wire bonding.

Figure 4:
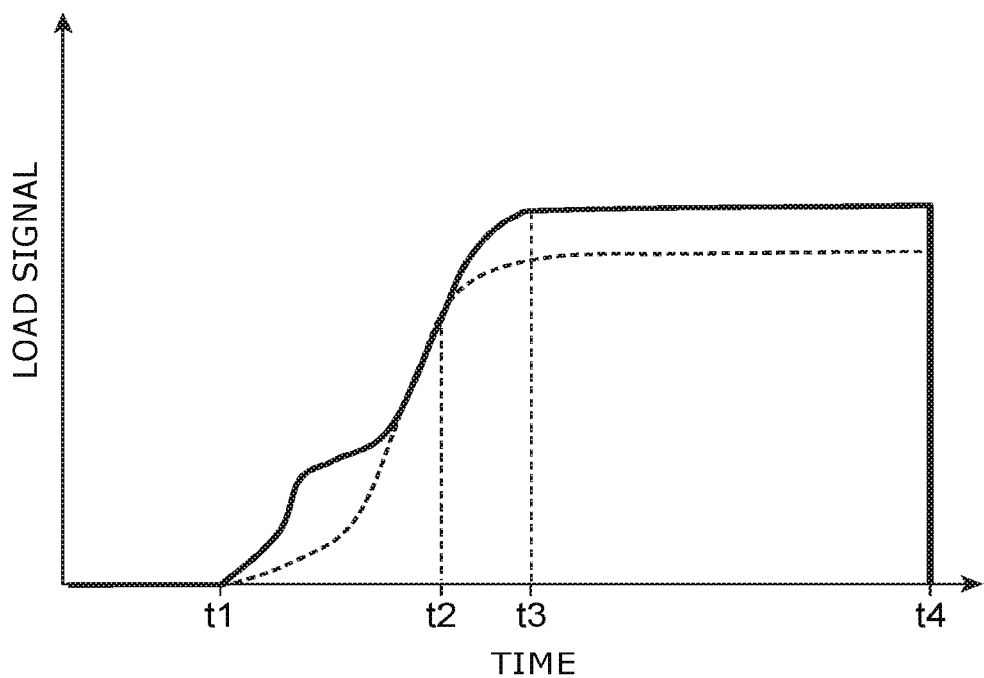
FIG. 4 is a graph showing another example of the load signal waveform output from the load sensor when performing wire bonding.

FIG. 4 is a graph showing another example of the load signal waveform output from the load sensor when performing wire bonding.

In FIGS. 3 and 4, a solid line illustrates the load signal waveform when the bonding state of the wire 3 onto the bonding portion 2 is good, and a broken line illustrates the load signal waveform when the bonding state of the wire 3 onto the bonding portion 2 is defective. The load signal waveform illustrates the change of the magnitude of the load (the load signal) over time.

When the bonding tool 11 is moved (lowered) in the Z-direction toward the bonding portion 2, the wire 3 that is held by the bonding tool 11 contacts the bonding portion 2 at a timing t1. The load that is detected by the load sensor 40 starts to increase when the wire 3 contacts the bonding portion 2. As the bonding tool 11 is lowered further, the load that is detected by the load sensor 40 increases until a timing t2 is reached. The timing t2 is the timing of starting a bonding operation in which the bonding tool 11 bonds the wire 3 to the bonding portion 2 by applying a prescribed load to the bonding portion 2 while causing the ultrasonic vibration to be generated from the ultrasonic horn 12. The timing t2 is, for example, the timing at which the value of the load becomes equal to or greater than a prescribed value. The timing t2 may be, for example, the timing at which the position in the Z-direction of the bonding tool 11 becomes equal to or lower than a prescribed position. The timing t2 may be, for example, the timing at which the movement speed in the Z-direction of the bonding tool 11 becomes equal to or less than a prescribed value. When the bonding operation is started, the load that is detected by the load sensor 40 decreases and then remains flat between a timing t3 and a timing t4 as in FIG. 3. Or, according to the bonding conditions, there are also cases where the load that is detected by the load sensor 40 increases and then remains flat between the timing t3 and the timing t4 as in FIG. 4. When the timing t4 is reached, the bonding tool 11 is moved (raised) in the Z-direction away from the bonding portion 2, and the wire 3 is cut (a wire-cut). The load that is detected by the load sensor 40 becomes zero when the wire-cut is performed.

As illustrated in FIGS. 3 and 4, the load signal waveform (the solid line) between the timing t1 and the timing t2 when the bonding state of the wire 3 onto the bonding portion 2 is good is different from the load signal waveform (the broken line) when the bonding state of the wire 3 onto the bonding portion 2 is defective. For example, the load when the bonding state of the wire 3 onto the bonding portion 2 is good increases while inflexing between the timing t1 and the timing t2 as illustrated in FIGS. 3 and 4. On the other hand, for example, the load when the bonding state of the wire 3 onto the bonding portion 2 is defective increases without inflexing between the timing t1 and the timing t2 as illustrated in FIGS. 3 and 4.

It is considered that such a difference between the load signal waveforms between the timing t1 and the timing t2 occurs due to, for example, the difference between the states of the bonding portions 2. In particular, it is considered that when the bump 2a is formed in the bonding portion 2, for example, the difference between the load signal waveforms between the timing t1 and the timing t2 occurs due to the height, shape, etc., of the bump 2a.

In the embodiment, the controller 50 calculates a determination value from the load detected by the load sensor 40 between when the wire 3 contacts the bonding portion 2 and when the ultrasonic vibration is generated (between the timing t1 and the timing t2), and controls the operation of the bonding tool 11 and the ultrasonic horn 12 based on the determination value. The method for calculating the determination value is described below.

More specifically, the controller 50 performs the bonding operation when the determination value is within a preset reference range. For example, when the determination value is outside the reference range, the controller 50 stops the operation of the bonding tool 11 and the ultrasonic horn 12 without performing the bonding operation. For example, when the determination value is outside the reference range, the controller 50 may stop the operation of the bonding tool 11 and the ultrasonic horn 12 after performing the bonding operation.

For example, the controller 50 may perform the bonding operation using a first condition when the determination value is within the reference range, and may perform the bonding operation using a second condition that is different from the first condition when the determination value is outside the reference range. In such a case, the first condition and the second condition are different from each other for at least one of the output of the ultrasonic vibration generated from the ultrasonic horn 12, the duration that the bonding operation is performed, or the load applied from the bonding tool 11 to the bonding portion 2. That is, for example, the controller 50 may change at least one of the output of the ultrasonic vibration generated from the ultrasonic horn 12, the duration that the bonding operation is performed, or the load applied from the bonding tool 11 to the bonding portion 2 when performing the bonding operation between when the determination value is outside the reference range and when the determination value is within the reference range.

The part of the controller 50 that calculates the determination value may be provided separately from the part that controls the operations of the components. That is, the controller 50 may include a control region that controls the operations of the components, and an analysis region that calculates the determination value.

For example, the controller 50 may estimate the goodness of the bonding state of the wire 3 onto the bonding portion 2 based on the determination value. In such a case, the controller 50 may display the estimation result of the goodness of the bonding state in a displayer electrically connected to the controller 50, etc.

Examples of the method for calculating the determination value will now be described.

Figure 5A:
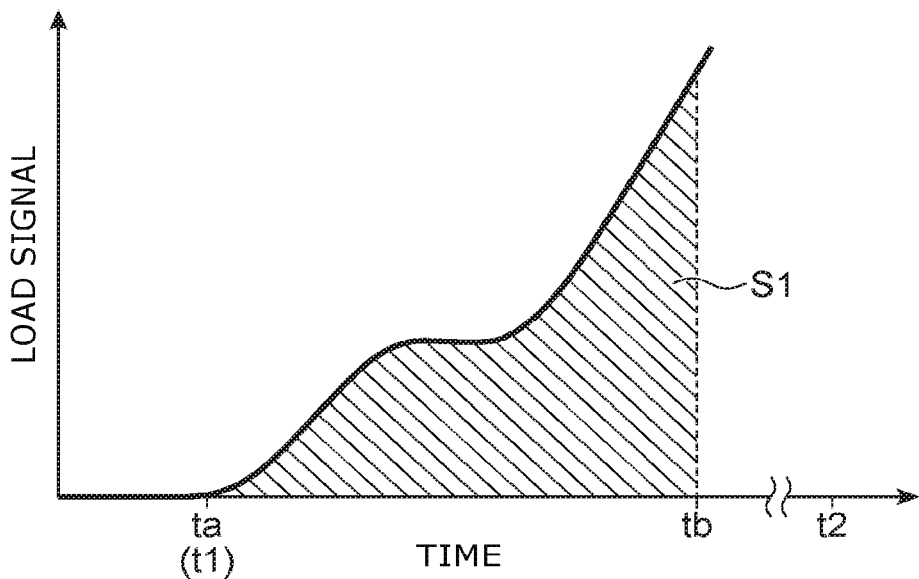
FIGS. 5A and 5B are descriptive views showing an example of the method for calculating the determination value.
Figure 5B:
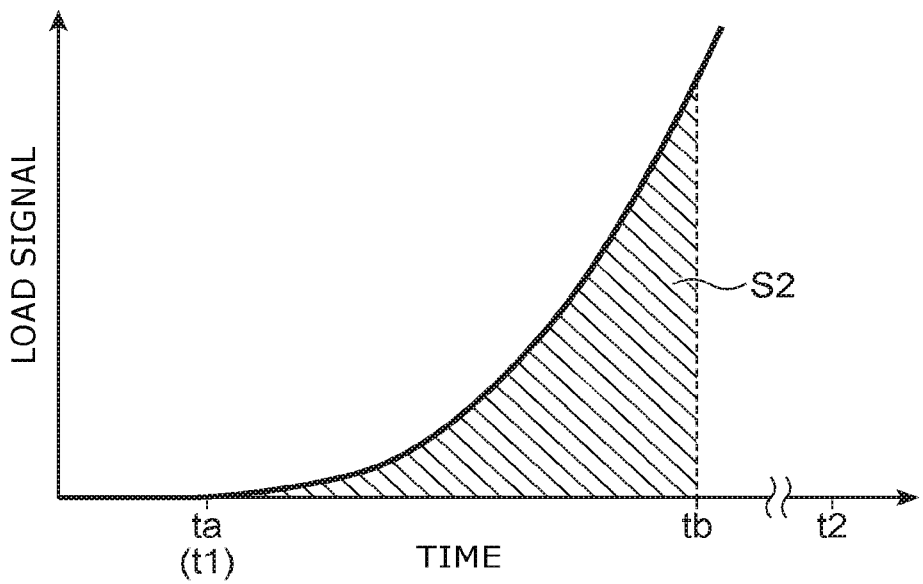

FIGS. 5A and 5B are descriptive views showing an example of the method for calculating the determination value. FIG. 5A illustrates the load signal waveform when the bonding state of the wire 3 onto the bonding portion 2 is good. On the other hand, FIG. 5B illustrates the load signal waveform when the bonding state of the wire 3 onto the bonding portion 2 is defective.

As illustrated in FIGS. 5A and 5B, the determination value is, for example, the time integral of the load in an arbitrary time interval of the load signal waveform detected by the load sensor 40 between when the wire 3 contacts the bonding portion 2 and when the ultrasonic vibration is generated.

In the example of FIGS. 5A and 5B, the arbitrary time interval is between a timing ta and a timing tb. The timing ta and the timing tb are any timing between the timing t1 and the timing t2. The timing ta may be the same as the timing t1. In FIGS. 5A and 5B, the time integral of the load between the timing ta and the timing tb is illustrated as the surface area of the region illustrated by diagonal lines.

As illustrated in FIGS. 5A and 5B, for example, a time integral S1 when the bonding state of the wire 3 onto the bonding portion 2 is good is greater than a time integral S2 when the bonding state of the wire 3 onto the bonding portion 2 is defective. In such a case, the lower limit of the reference range is set to a value that is greater than the time integral S2 and less than the time integral S1. The upper limit of the reference range is set to a value that is greater than the time integral S1.

Figure 6A:
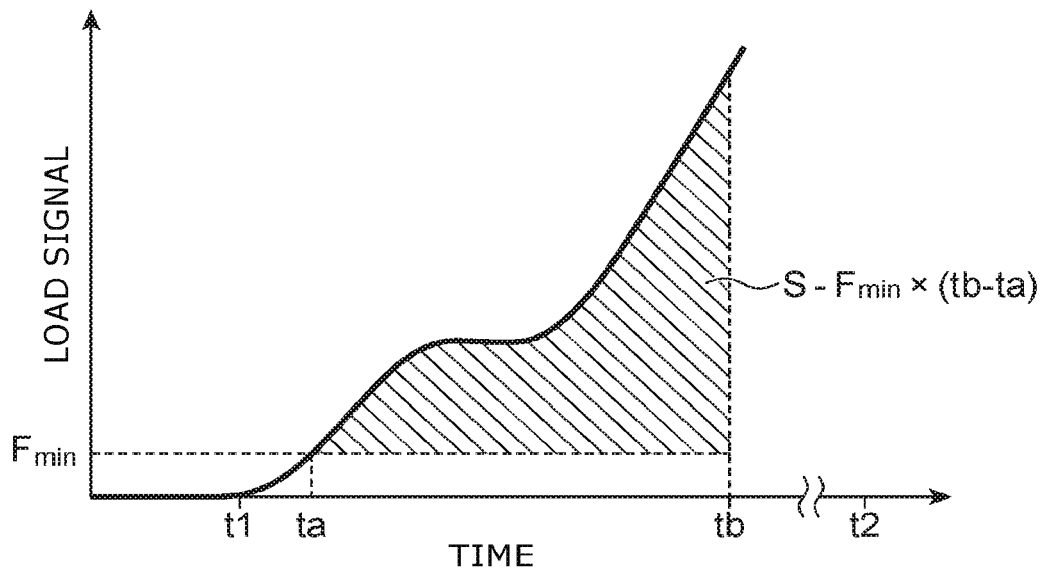
FIGS. 6A and 6B are descriptive views showing a modification of the method for calculating the determination value illustrated in FIGS. 5A and 5B.
Figure 6B:
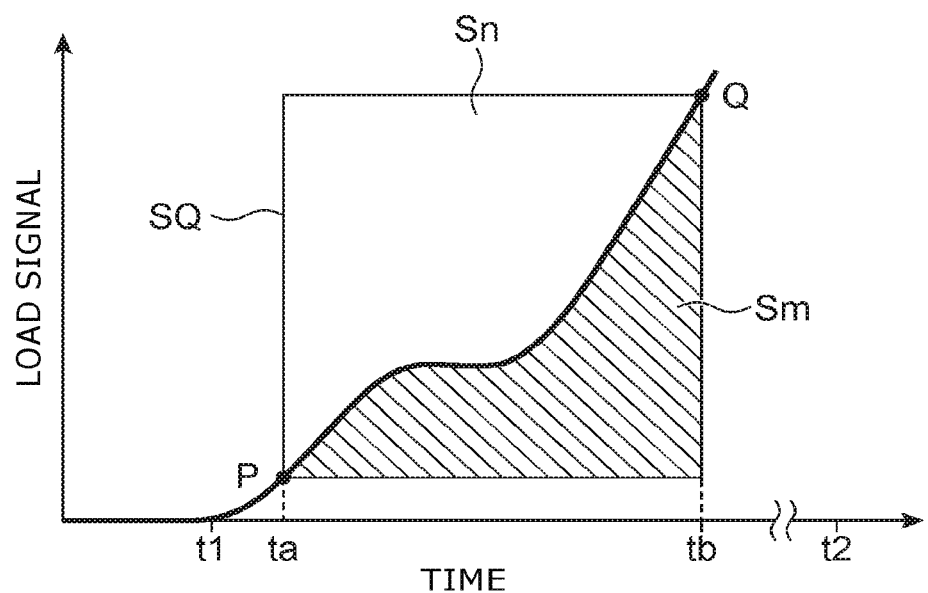

FIGS. 6A and 6B are descriptive views showing a modification of the method for calculating the determination value illustrated in FIGS. 5A and 5B. FIGS. 6A and 6B illustrate the load signal waveform when the bonding state of the wire 3 onto the bonding portion 2 is good.

As illustrated in FIG. 6A, the determination value may be a portion of the time integral of the load in an arbitrary time interval of the load signal waveform detected by the load sensor 40 between when the wire 3 contacts the bonding portion 2 and when the ultrasonic vibration is generated.

In the example of FIG. 6A, the determination value is represented by, for example, S−Fmin×(tb−ta). S is the time integral S1 or S2 of the load between the timing ta and the timing tb illustrated in FIGS. 5A and 5B. Fmin is the magnitude of the load at the timing ta. In FIG. 6A, S−Fmin× (tb−ta) is illustrated as the surface area of the region illustrated by diagonal lines.

As illustrated in FIG. 6B, the determination value may be the proportion (the area ratio) of the time integral in an arbitrary time interval of the load signal waveform detected by the load sensor 40 between when the wire 3 contacts the bonding portion 2 and when the ultrasonic vibration is generated.

In the example of FIG. 6B, for example, the determination value is represented by Sm/Sn. Sm is, for example, S−Fmin× (tb−ta) illustrated in FIG. 6A. Sm may be, for example, the time integral S1 or S2 of the load between the timing ta and the timing tb illustrated in FIGS. 5A and 5B. In FIG. 6B, Sm is illustrated as the surface area of the region illustrated by diagonal lines. Sn is illustrated as the surface area of the region of a rectangle SQ including a point P at the timing ta and a point Q at the timing tb along the load signal waveform as opposite corners, minus Sm.

Figure 7A:
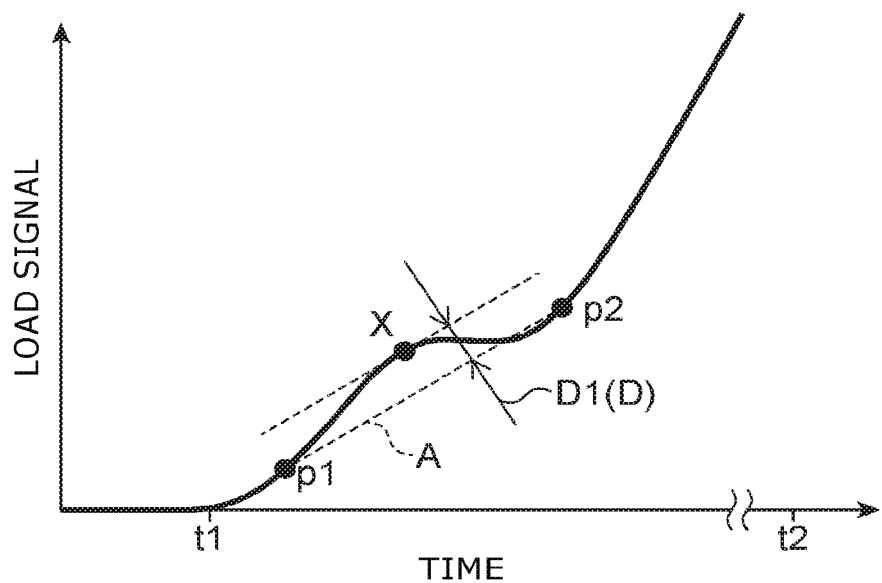
FIGS. 7A and 7B are descriptive views showing another example of the method for calculating the determination value.
Figure 7B:
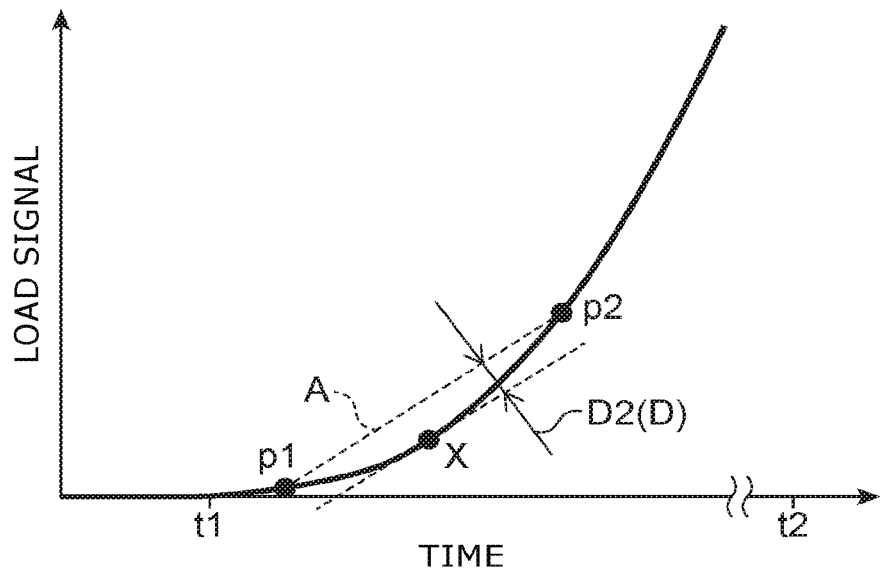

FIGS. 7A and 7B are descriptive views showing another example of the method for calculating the determination value.

FIG. 7A illustrates the load signal waveform when the bonding state of the wire 3 onto the bonding portion 2 is good. On the other hand, FIG. 7B illustrates the load signal waveform when the bonding state of the wire 3 onto the bonding portion 2 is defective.

As illustrated in FIGS. 7A and 7B, the determination value may be, for example, the maximum distance between a straight line connecting any two points along the load signal waveform detected by the load sensor 40 between when the wire 3 contacts the bonding portion 2 and when the ultrasonic vibration is generated and the load signal waveform between the two points.

In the example of FIGS. 7A and 7B, the two points are a point p1 and a point p2. The point p1 and the point p2 are any points along the load signal waveform between the timing t1 and the timing t2. The straight line that connects the two points is a straight line A. In FIGS. 7A and 7B, the determination value is represented by a distance D between the straight line A and a point X along the load signal waveform that is the furthest from the straight line A between the point p1 and the point p2. The distance D is a positive value when the point X is above the straight line A, and the distance D is a negative value when the point X is below the straight line A. That is, a distance D1 of FIG. 7A is a positive value, and a distance D2 of FIG. 7B is a negative value.

As illustrated in FIGS. 7A and 7B, for example, the distance D1 when the bonding state of the wire 3 onto the bonding portion 2 is good is greater than the distance D2 when the bonding state of the wire 3 onto the bonding portion 2 is defective. In such a case, the lower limit of the reference range is set to a value that is greater than the distance D2 and less than the distance D1. The upper limit of the reference range is set to a value that is greater than the distance D1.

Figure 8A:
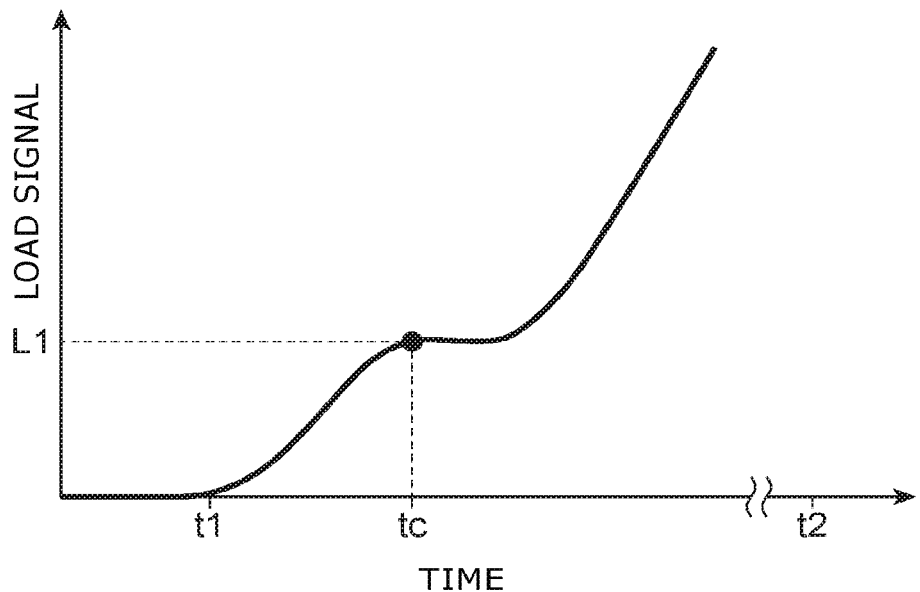
FIGS. 8A and 8B are descriptive views showing another example of the method for calculating the determination value.
Figure 8B:
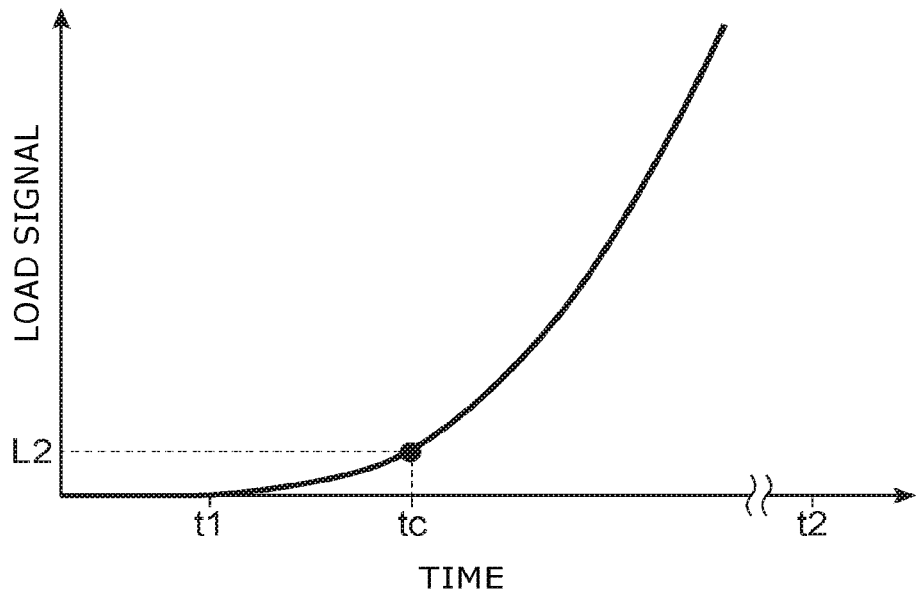

FIGS. 8A and 8B are descriptive views showing another example of the method for calculating the determination value.

FIG. 8A illustrates the load signal waveform when the bonding state of the wire 3 onto the bonding portion 2 is good. On the other hand, FIG. 8B illustrates the load signal waveform when the bonding state of the wire 3 onto the bonding portion 2 is defective.

As illustrated in FIGS. 8A and 8B, the determination value may be, for example, the magnitude of the load at any timing of the load signal waveform detected by the load sensor 40 between when the wire 3 contacts the bonding portion 2 and when the ultrasonic vibration is generated.

In the example of FIGS. 8A and 8B, the arbitrary timing tc is any timing between the timing t1 and the timing t2.

As illustrated in FIGS. 8A and 8B, for example, a magnitude L1 of the load at the timing tc when the bonding state of the wire 3 onto the bonding portion 2 is good is greater than a magnitude L2 of the load at the timing tc when the bonding state of the wire 3 onto the bonding portion 2 is defective. In such a case, the lower limit of the reference range is set to a value that is greater than the magnitude L2 of the load and less than the magnitude L1 of the load. The upper limit of the reference range is set to a value that is greater than the magnitude L1 of the load.

Figure 9A:
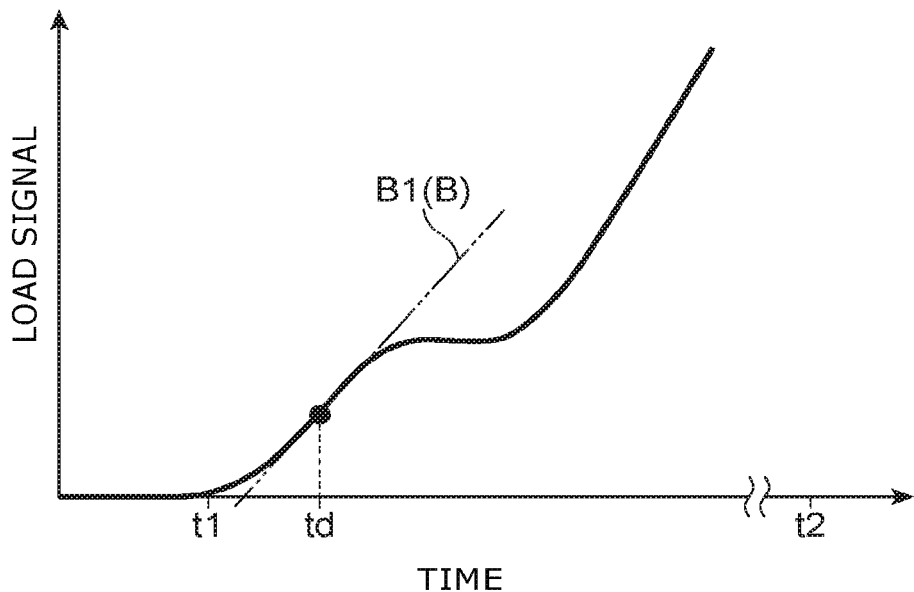
FIGS. 9A and 9B are descriptive views showing another example of the method for calculating the determination value.
Figure 9B:
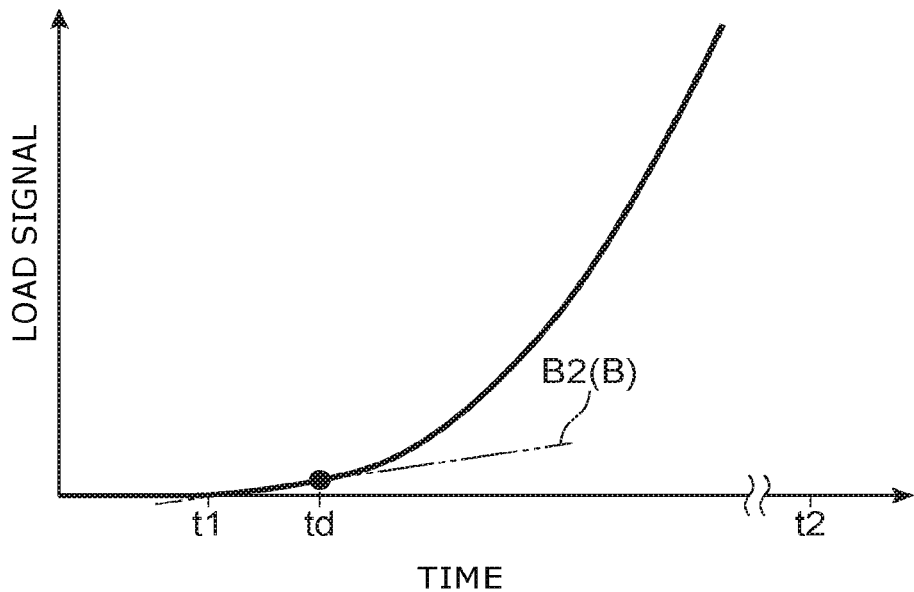

FIGS. 9A and 9B are descriptive views showing another example of the method for calculating the determination value.

FIG. 9A illustrates the load signal waveform when the bonding state of the wire 3 onto the bonding portion 2 is good. On the other hand, FIG. 9B illustrates the load signal waveform when the bonding state of the wire 3 onto the bonding portion 2 is defective.

As illustrated in FIGS. 9A and 9B, the determination value may be, for example, the time derivative of the load at any timing of the load signal waveform detected by the load sensor 40 between when the wire 3 contacts the bonding portion 2 and when the ultrasonic vibration is generated.

In the example of FIGS. 9A and 9B, an arbitrary timing td is any timing between the timing t1 and the timing t2. In FIGS. 9A and 9B, the time derivative of the load at the timing td is illustrated as the slope of a tangent B with respect to the load signal waveform at the timing td illustrated by a double dot-dash line.

As illustrated in FIGS. 9A and 9B, for example, the time derivative (the slope of a tangent B1) when the bonding state of the wire 3 onto the bonding portion 2 is good is greater than the time derivative (the slope of a tangent B2) when the bonding state of the wire 3 onto the bonding portion 2 is defective. In such a case, the lower limit of the reference range is set to a value that is greater than the time derivative (the slope of the tangent B2) and less than the time derivative (the slope of the tangent B1). The upper limit of the reference range is set to a value that is greater than the time derivative (the slope of the tangent B1).

A wire bonding method according to the embodiment will now be described.

The wire bonding method according to the embodiment includes a search process, an analysis process, and an operation process. For example, the search process, the analysis process, and the operation process are repeatedly performed in the wire bonding method according to the embodiment.

In the search process, the load that is applied to the bonding portion 2 is continuously detected while applying the load to cause the wire 3 to contact the bonding portion 2. In the analysis process, the determination value is calculated from the load detected in the search process. In the operation process, the bonding operation is performed when the determination value calculated in the analysis process is within the preset reference range so that the wire 3 is bonded to the bonding portion 2 by generating the ultrasonic vibration in the state in which the load is applied to the bonding portion 2; and when the determination value calculated in the analysis process is outside the reference range, a different operation from when the determination value is within the reference range is performed. Here, "a different operation from when the determination value is within the reference range" includes, for example, not performing the bonding operation, stopping the apparatus after performing the bonding operation, performing the bonding operation by using a different condition from when the determination value is within the reference range, etc. The flow of each case will now be described.

Figure 10:
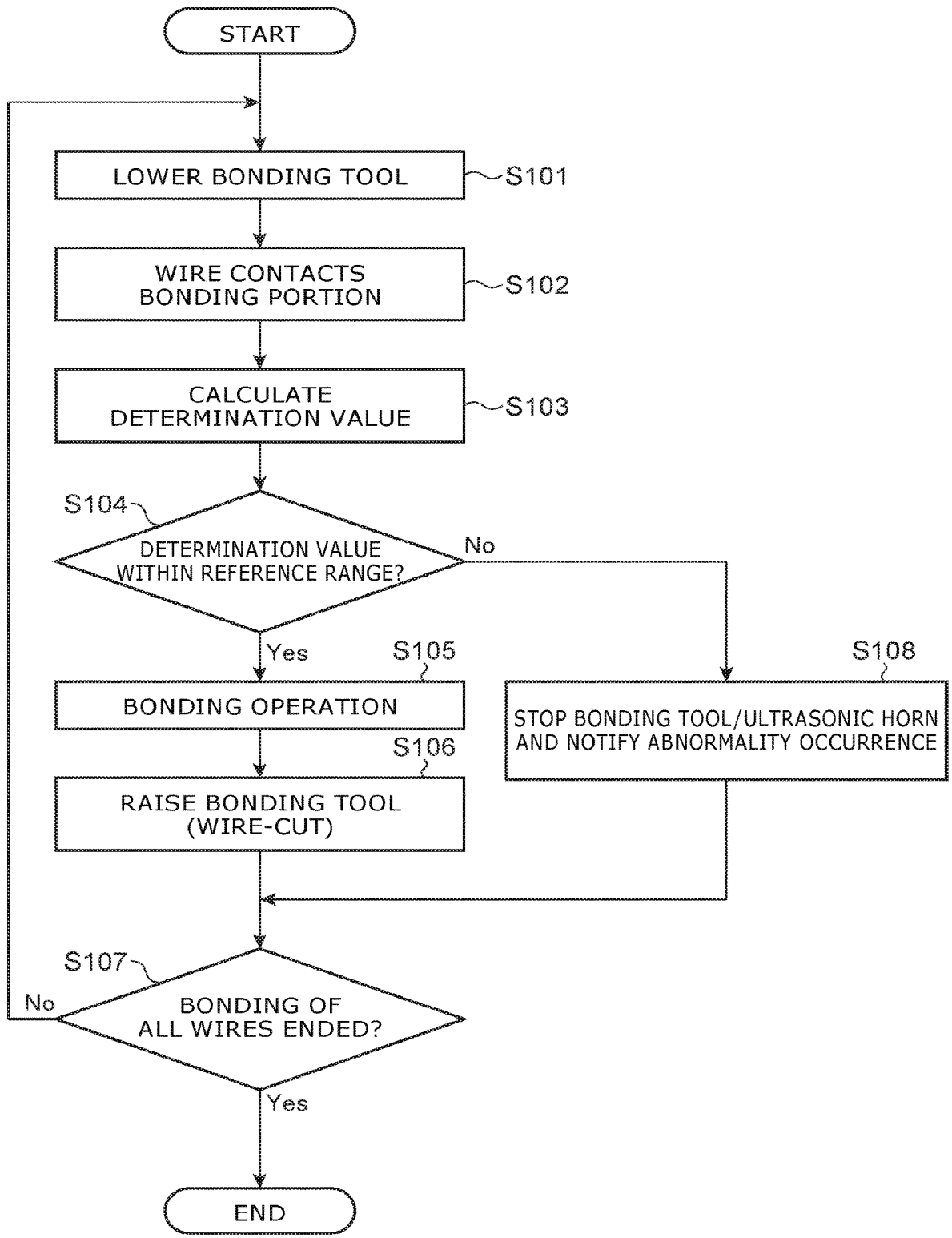
FIG. 10 is a flowchart showing an example of the wire bonding method according to the embodiment.

FIG. 10 is a flowchart showing an example of the wire bonding method according to the embodiment.

As illustrated in FIG. 10, the controller 50 lowers the bonding tool 11 toward the bonding portion 2 of the workpiece 1 (step S101). The controller 50 lowers the bonding tool 11 until the wire 3 held by the bonding tool 11 contacts the bonding portion 2 (step S102).

When the wire 3 contacts the bonding portion 2, the controller 50 calculates the determination value from the load detected by the load sensor 40 (step S103). When calculating the determination value, the controller 50 determines whether or not the determination value is within a preset reference range (step S104).

When the determination value is within the reference range (step S104: Yes), the controller 50 performs a bonding operation of bonding the wire 3 to the bonding portion 2 by causing an ultrasonic vibration to be generated from the ultrasonic horn 12 while controlling the position in the Z-direction of the bonding tool 11 so that a preset load is applied from the bonding tool 11 to the bonding portion 2 (step S105).

When a prescribed period of time has elapsed, the controller 50 raises the bonding tool 11 and cuts the wire 3 (a wire-cut) (step S106). When the bonding of all of the wires has ended (step S107: Yes), the controller 50 moves the bonding tool 11 to the origin and ends the bonding. When the bonding of all of the wires has not ended (step S107: No), the controller 50 moves the bonding tool 11 to the next bonding portion 2, the flow returns to step S101, and the next wire bonding is started.

When the determination value is outside the reference range (step S104: No), the controller 50 stops the operation of the bonding tool 11 and the ultrasonic horn 12 without performing the bonding operation (step S108). At this time, for example, the controller 50 may notify that an abnormality has occurred by lighting an abnormality occurrence lamp, etc. After step S108 is performed, the controller 50 may restart the operation after performing some procedure (toward step S107).

In the flow, steps S101 and S102 are the search process, steps S103 and S104 are the analysis process, and steps S105 to S108 are the operation process.

Figure 11:
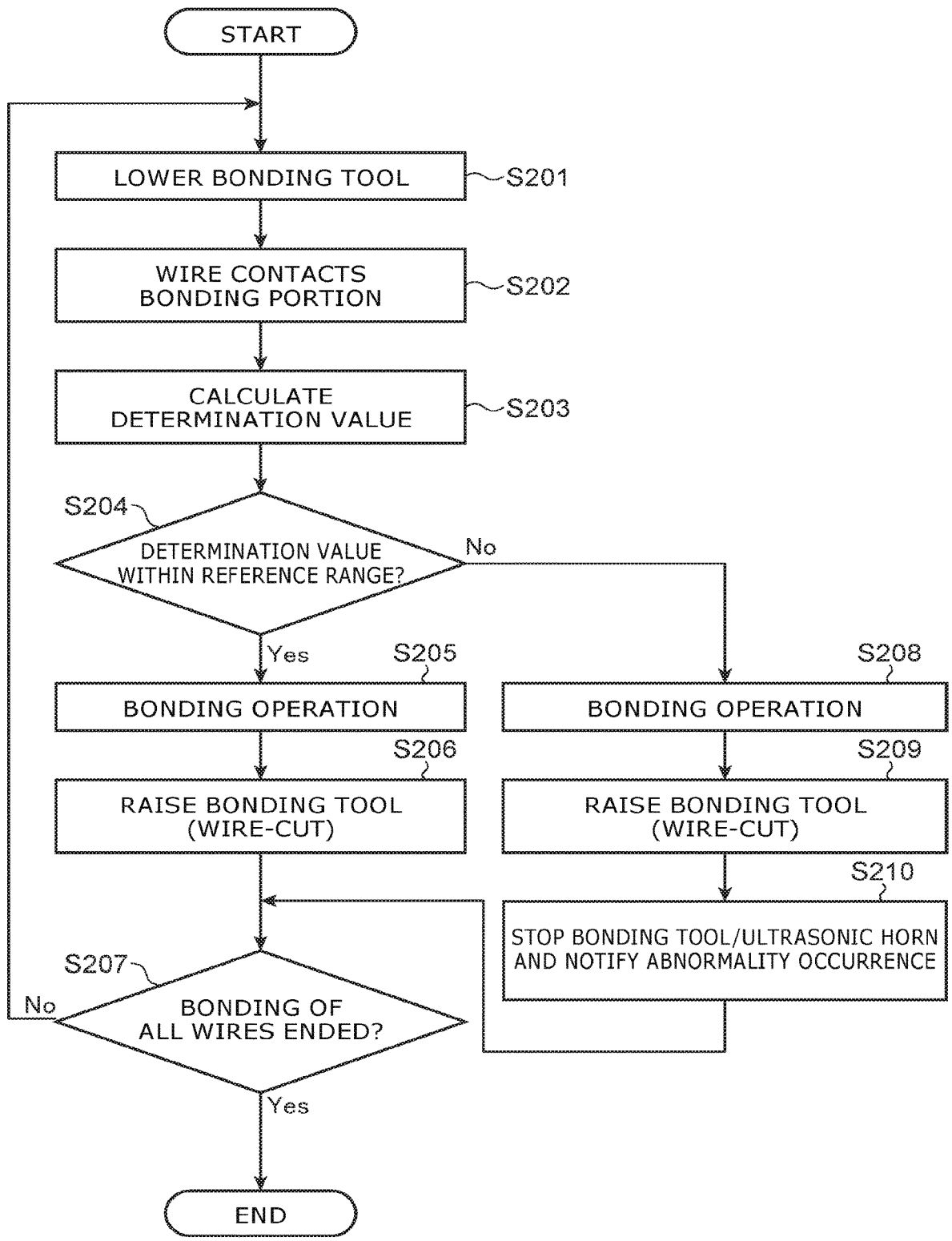
FIG. 11 is a flowchart showing another example of the wire bonding method according to the embodiment.

FIG. 11 is a flowchart showing another example of the wire bonding method according to the embodiment.

Steps S201 to S207 of the flowchart shown in FIG. 11 are substantially the same as steps S101 to S107 of the flowchart shown in FIG. 10, and a description is therefore omitted.

In the flowchart shown in FIG. 11, when the determination value is outside the reference range (step S204: No), the controller 50 performs the bonding operation similarly to step S205 (step S208) and performs the wire-cut similarly to step S206 (step S209). After performing the wire-cut, the controller 50 stops the operation of the bonding tool 11 and the ultrasonic horn 12 (step S210). At this time, for example, the controller 50 may notify that an abnormality has occurred by lighting an abnormality occurrence lamp, etc. After step S210 is performed, the controller 50 may restart the operation after performing some procedure (toward step S207).

In the flow, steps S201 and S202 are the search process, steps S203 and S204 are the analysis process, and steps S205 to S210 are the operation process.

Figure 12:
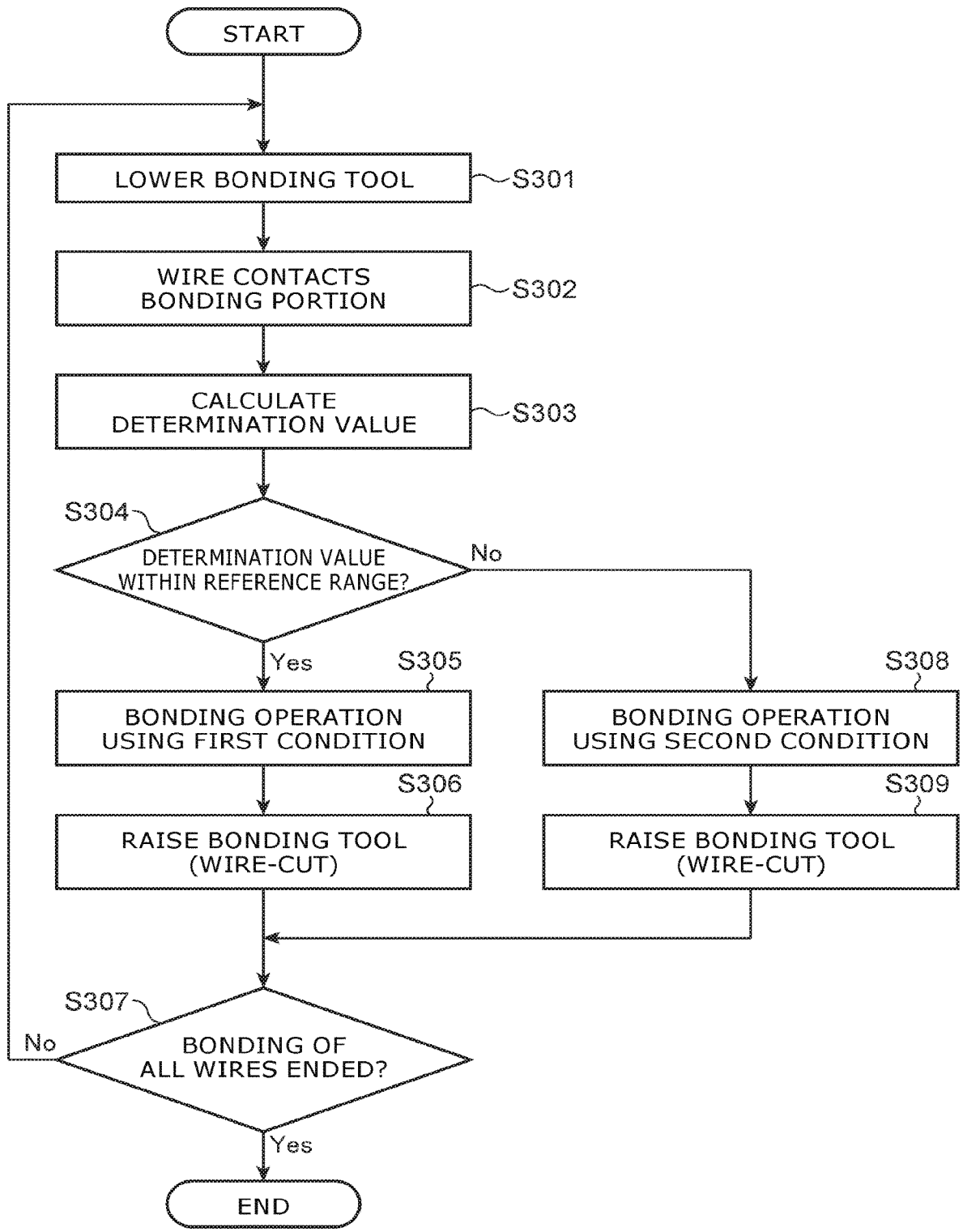
FIG. 12 is a flowchart showing another example of the wire bonding method according to the embodiment.

FIG. 12 is a flowchart showing another example of the wire bonding method according to the embodiment.

Steps S301 to S307 of the flowchart shown in FIG. 12 are substantially the same as steps S101 to S107 of the flowchart shown in FIG. 10, and a description is therefore omitted. In step S305, the controller 50 performs the bonding operation by using the first condition.

In the flowchart shown in FIG. 12, when the determination value is outside the reference range (step S304: No), the controller 50 performs the bonding operation by using a second condition that is different from the first condition of the bonding operation of step S305 (step S308). After performing the bonding operation, the controller 50 performs the wire-cut similarly to step S306 (step S309). After performing the wire-cut, the controller 50 determines whether or not the bonding of all of the wires has ended (step S307).

After the wire-cut (step S309) is performed in the embodiment, the controller 50 may stop the operation of the bonding tool 11 and the ultrasonic horn 12 without performing step S307. At this time, for example, the controller 50 may notify that an abnormality has occurred by lighting an abnormality occurrence lamp, etc.

In the flow, steps S301 and S302 are the search process, steps S303 and S304 are the analysis process, and steps S305 to S309 are the operation process.

Effects of the wire bonding apparatus according to the embodiment and the wire bonding method according to the embodiment will now be described.

The manufacturing processes of a semiconductor device use many wire bonding apparatuses, in which a wire is connected between a pad and a lead, the wire is a metal wire, the pad is an electrode of a semiconductor chip, and the lead is an electrode of a leadframe or a substrate. Normally, in wire bonding using such a wire bonding apparatus, a bonding tool is moved in the Z-direction with respect to a bonding portion of the pad, the lead, etc., and an ultrasonic vibration is applied by an ultrasonic horn to the wire held by the tip of the bonding tool while pressing and compression-bonding the wire to the bonding portion.

When performing wire bonding by such a method, according to the state of the bonding portion, etc., there are cases where a bonding defect occurs in which the wire is detached from the bonding portion without obtaining a sufficient bonding strength between the bonding portion and the wire, etc. In particular, when the wire is bonded to a bump formed in the bonding portion, there are cases where a bonding defect occurs in which the wire is detached from the bump without obtaining a sufficient bonding strength between the bump and the wire due to the height, shape, etc., of the bump or the like. It is considered that this is because when the height, shape, etc., of the bump are abnormal, the bonding area between the wire and the bump may be reduced, a sufficient load may not be applied to the bonding portion due to deformation of the bump when bonding, etc.

Therefore, it has been proposed to use a method of detecting the bonding defect between the bonding portion and the wire by the detection of the conduction, the capacitance, or the like, or a method of determining the goodness of the bonding state between the wire and the bonding portion by detecting the position in the Z-direction of the bonding tool and/or the load when bonding. However, in such conventional methods for detecting the bonding defect, even though a product in which a bonding defect has occurred can be found after bonding, the occurrence of the bonding defect itself cannot be suppressed because the occurrence of the bonding defect is detected partway through the bonding operation of bonding the wire to the bonding portion or after completing the bonding operation. Therefore, the yield of the product is undesirably reduced.

Therefore, in the embodiment, the load sensor 40 is provided to continuously detect the load applied from the bonding tool 11 to the bonding portion 2, and the controller calculates the determination value from the load detected by the load sensor 40 between when the wire 3 contacts the bonding portion 2 and when the ultrasonic vibration is generated, and controls the operation of the bonding tool 11 and the ultrasonic horn 12 based on the determination value.

Thereby, for example, the goodness of the bonding state of the wire 3 onto the bonding portion 2 can be estimated before performing the bonding operation. That is, before actually performing the bonding operation, it can be estimated whether or not a bonding defect will occur if the bonding operation is performed. Accordingly, when it is estimated that the bonding state of the wire 3 onto the bonding portion 2 is poor, the occurrence of the bonding defect can be prevented beforehand by performing a different operation from when it is estimated that the bonding state is good (e.g., not performing the bonding operation, stopping the apparatus after performing the bonding operation, performing the bonding operation by using a different condition, etc.).

More specifically, for example, the controller 50 performs the bonding operation when the determination value is within the reference range, and stops the operation of the bonding tool 11 and the ultrasonic horn 12 without performing the bonding operation when the determination value is outside the reference range. Thereby, the occurrence of bonding defects can be more reliably suppressed, and the yield of the product can be increased.

Or, for example, the controller 50 performs the bonding operation when the determination value is within the reference range, and stops the operation of the bonding tool 11 and the ultrasonic horn 12 after performing the bonding operation when the determination value is outside the reference range. Thereby, the yield of the product can be improved further while suppressing the occurrence of bonding defects. For example, when a change of the determination value occurs in a good bonded product, such a control can be used as a preindication of the occurrence of a bonding defect to prevent the occurrence of the bonding defect beforehand.

Or, for example, the controller 50 performs the bonding operation by using the first condition when the determination value is within the reference range and performs the bonding operation by using the second condition that is different from the first condition when the determination value is outside the reference range. Thereby, the yield of the product can be improved further while suppressing the occurrence of bonding defects.

According to the embodiments as described above, a wire bonding apparatus and a wire bonding method are provided in which the occurrence of bonding defects between a bonding portion and a wire can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A wire bonding apparatus bonding a wire to a bonding portion of a workpiece by generating an ultrasonic vibration in a state of pressing the wire onto the bonding portion, the apparatus comprising:
    a bonding tool causing the wire to contact the bonding portion of the workpiece and applying a load;
    an ultrasonic horn generating the ultrasonic vibration;
    a load sensor continuously detecting the load applied from the bonding tool to the bonding portion of the workpiece; and
    a controller controlling an operation of the bonding tool and the ultrasonic horn, the controller analyzing data of the load output from the load sensor between when the wire contacts the bonding portion of the workpiece and when the ultrasonic vibration is generated, and controlling the operation of the bonding tool and the ultrasonic horn based on an analysis result;
    wherein the controller calculates a determination value from the load detected by the load sensor between when the wire contacts the bonding portion of the workpiece and when the ultrasonic vibration is generated, and controls the operation of the bonding tool and the ultrasonic horn based on the determination value; and
    wherein the determination value is a time integral of the load in an arbitrary time interval of a load signal waveform based on a bump in the bonding portion of the workpiece and detected by the load sensor between when the wire contacts the bonding portion of the workpiece and when the ultrasonic vibration is generated.

2. The apparatus according to claim 1, wherein when the determination value is within a reference range that is preset, the controller performs a bonding operation of bonding the wire to the bonding portion by causing the ultrasonic vibration to be generated from the ultrasonic horn in a state in which the load is applied from the bonding tool to the bonding portion, and
    when the determination value is outside the reference range, the controller stops the operation of the bonding tool and the ultrasonic horn without performing the bonding operation.

3. The apparatus according to claim 1, wherein
    when the determination value is within a reference range that is preset, the controller performs a bonding operation of bonding the wire to the bonding portion by causing the ultrasonic vibration to be generated from the ultrasonic horn in a state in which the load is applied from the bonding tool to the bonding portion, and
    when the determination value is outside the reference range, the controller stops the operation of the bonding tool and the ultrasonic horn after performing the bonding operation.

4. The apparatus according to claim 1, wherein
    when the determination value is within a reference range that is preset, the controller uses a first condition to perform a bonding operation of bonding the wire to the bonding portion by causing the ultrasonic vibration to be generated from the ultrasonic horn in a state in which the load is applied from the bonding tool to the bonding portion, and
    when the determination value is outside the reference range, the controller uses a second condition to perform the bonding operation, the second condition being different from the first condition.

5. The apparatus according to claim 4, wherein
    the first condition and the second condition are different from each other for at least an output of the ultrasonic vibration generated from the ultrasonic horn.

6. The apparatus according to claim 4, wherein
    the first condition and the second condition are different from each other for at least a duration that the bonding operation is performed.

7. The apparatus according to claim 4, wherein
    the first condition and the second condition are different from each other for at least the load applied from the bonding tool to the bonding portion.

* * * * *